(12) United States Patent
Khusnatdinov et al.

(10) Patent No.: US 6,958,207 B1
(45) Date of Patent: Oct. 25, 2005

(54) METHOD FOR PRODUCING LARGE AREA ANTIREFLECTIVE MICROTEXTURED SURFACES

(76) Inventors: Niyaz Khusnatdinov, 11 Davis Rd., Acton, MA (US) 01720; Tanwin Chang, 15 Hancock St., Apt. 1, Somerville, MA (US) 02144

(*) Notice: Subject to any disclaimer, the term of this patent is extended or adjusted under 35 U.S.C. 154(b) by 157 days.

(21) Appl. No.: 10/314,031

(22) Filed: Dec. 7, 2002

(51) Int. Cl.[7] ............................................. G02B 5/00
(52) U.S. Cl. ..................... 430/321; 430/322; 430/323
(58) Field of Search .............................. 430/321, 322, 430/323; 216/24

(56) References Cited

U.S. PATENT DOCUMENTS

| | | | |
|---|---|---|---|
| 4,013,465 A | 3/1977 | Clapham et al. | |
| 4,114,983 A | 9/1978 | Maffitt et al. | |
| 4,333,983 A | 6/1982 | Allen | |
| 4,512,848 A | 4/1985 | Deckman et al. | |
| 4,758,296 A | 7/1988 | McGrew | |
| 5,120,605 A | 6/1992 | Zuel et al. | |
| 5,597,613 A | 1/1997 | Galarneau et al. | |
| 5,817,396 A | 10/1998 | Perlo et al. | |
| 5,820,957 A | 10/1998 | Schroeder et al. | |
| 6,175,442 B1 * | 1/2001 | Booth et al. | 359/290 |
| 6,359,735 B1 | 3/2002 | Gombert et al. | |
| 2002/0135869 A1 | 9/2002 | Banish et al. | |

OTHER PUBLICATIONS

Kahng and Pati, "Subwavelength Lithography and its Potential Impact on Design and EDA", Proc. DAC, pp 799–804, (1999).

Bernhard C. G., "Structural and Functional Adaptation in a Visual System", Endeavor, v26, p79–84 (1967).

Aizenberg et al., "Imaging profiles of light intensity in the near field: applications to phase–shift photolithography", Applied Optics, v37 n11, p2145–2152 (1998).

Raguin and Morris, "Structured Surfaces Mimic Coating Performance", Laser Focus World, p113–117 (Apr. 1997).

Toyota et la., "Fabrication of Microcone Array for Antireflection Structured Surface Using Metal Dotted Pattern", Jpn. J. Applied Physics, 40, L747 (2001).

J. Strümpfel et al., "Reactive Dual Magnetron Sputtering Of Oxides For Large Area Production Of Optical Multilayers", 40th Annual Tech. Conf. Soc. of Vacuum Coaters, New Orleans, (1997).

* cited by examiner

Primary Examiner—John A. McPherson
(74) Attorney, Agent, or Firm—Pro-Se

(57) ABSTRACT

A method employing a photolithography mask for producing microtextured antireflective surfaces is disclosed. The photolithography mask is used during the exposure of photoresist to a pattern of ultraviolet light. The exposed photoresist is subsequently processed to obtain a microtextured surface possessing antireflective properties. The antireflective surface profile comprises an array of sub-micron protuberances that may reside in a periodic arrangement, a quasiperiodic arrangement, or in an arbitrary non-periodic arrangement. The antireflective surface is designed for visible light. It may be scaled-up to large areas, and is suitable for replication into inexpensive polymer materials.

17 Claims, 9 Drawing Sheets

METHOD FOR PRODUCING LARGE AREA ANTIREFLECTIVE MICROTEXTURED SURFACES

TECHNICAL FIELD

This invention relates to antireflective microtextured surfaces. It further relates to microtextured antireflective polymeric films and resins. The present invention also relates to polymeric films that may be attached, adhered, or otherwise disposed onto optically transparent substrates to enhance their visual properties. Further, the present invention relates to methods for producing surface structures with gradient change of index of refraction. The invention also relates to the fabrication of large area, visually seamless microtextured surfaces.

BACKGROUND OF THE INVENTION

A need exists for an antireflective treatment that is characterized by extremely low reflectance and high transmittance over a broad wavelength band, even at high angles of incidence. Additionally, it must be cost effective, flexible, and able to cover large areas. Such a solution would be particularly useful as an easily distributed antireflective treatment that may be applied onto glazing materials for the picture frame industry, TV screens, personal handheld devices, cellular phones, shop windows, and other applications.

Optical coatings involving either single or multiple thin layers are well known in the prior art for antireflective purposes. This technique uses destructive interference from the interfaces between materials of different indices of refraction to reduce the overall reflectance. Production of such thin film treatments requires constant effort to maintain coating thickness and composition uniformity, and therefore they are difficult to form on large surfaces. Thin film antireflective coatings (AC) have traditionally been reserved for high-end optics, since they can have excellent optical properties, but have yet to be manufactured cost-effectively. For example, the optical characteristics of a single layer AC are highly sensitive to the wavelength, and have narrow angular acceptance. To get broadband and wide angular acceptance, an antireflective coating with multiple layers should be employed. However, that dramatically increases associated technical problems and significantly raises the cost.

The requirement for inexpensive solutions was understood many decades ago. Adams U.S. Pat. No. 2,348,704 describes a two-step acid etch process used to reduce the reflectivity of glass. The result of the acid etch was the formation of a microscopic network of pores, or skeletonized structure, in a thin layer near the surface of the glass. Precise control of the thickness of this porified layer allowed it to serve as a thin film of intermediate index in analogy to conventional optical coatings. Recently, a similar acid etching method has been proposed by Zuel et al. U.S. Pat. No. 5,120,605 to produce an antireflective treatment on glass that potentially can be used for large areas. It describes a method for a high-throughput treatment that results in a textured glass surface consisting of a distribution of islands and a superimposed porified layer. While relatively cost effective compared to vacuum deposited thin films, such acid etched solutions are limited to rigid glass substrates only and therefore the final product lacks flexibility.

Another class of inexpensive solutions, with potential cost reductions beyond even the acid etching techniques, involves replication of a texture into a plastic. Maffitt et al. U.S. Pat. No. 4,114,983 describes a method for production of a polymeric element with antireflective microstructured surface comprising a four-step process. Those steps include (1) creation of a master surface relief via a two step etch process in glass, (2) galvanic replication on the glass surface to create a durable metal stamper, (3) stamping into a heated thermoplastic material to transfer the surface relief into the plastic, and (4) release of the plastic element from the stamper. Essentially, the Maffitt patent teaches replication of an acid etched antireflective glass texture into a plastic optical element. However, the acid etched porified surface is not ideal for replication because the surface profile may have overhangs and voids that inhibit release, or cusps that break off during release, resulting in loss of fidelity with each replication. This leads to a reduction in the antireflective performance of the replicated polymer.

Polymeric materials not only serve the requirement of cost-effectiveness, but may also be employed to provide flexible antireflective solutions. Allen et al. U.S. Pat. No. 4,333,983 discloses the use of a thin layer of aluminum oxide to form the adhesion layer between a pliable polymer substrate and a thin dielectric optical coating. The result is a flexible antireflective film for applications that do not require very high performance optical coatings. The Allen patent asserts that such a polymer antireflective film can be inexpensively distributed, since a manufacturer wishing to add an antireflection coating to an optical element can simply purchase the film, cut it to desired geometry, and then apply it to the article. With the advent of dual magnetron sputtering technology, as described by J. Strümpfel et al. (40th Annual Tech. Conf. Soc. of Vacuum Coaters, New Orleans, 1997), large area uniform coatings on polymer webs are possible. However, this technology attains antireflectivity in the same manner as thin film optical coatings, and therefore is still subject to limitations in band performance and angular acceptance. In addition, mechanical integrity due to cracking and separation of layers remains an issue, as well as the cost of manufacturing.

Rather than providing a deposited or sputtered optical coating, the polymer film may be provided with a microtextured surface to achieve the antireflective properties. Schroeder et al. U.S. Pat. No. 5,820,957 discloses an optically transparent polymeric film with textured surface, and an adhesive on the backside. The textured surface functions to diffuse incident light to a degree sufficient to reduce specular gloss. This patent describes a process of very inexpensive replication, potentially much cheaper than magnetron sputtering. To be specific, the Shroeder patent describes an antiglare texture, but the described replication principle can also be applied to antireflective surfaces. That is, the textured film of the patent receives the texturing by casting, imprinting, or embossing from a previously textured master. Thus the properties of the master texture are essential to the optical behavior of the replicated film. This leads back to the problem inherent in the Maffitt patent, i.e. what is a desirable surface profile for the antireflective master to obtain high optical quality and efficient replication?

Clapham and Hutley U.S. Pat. No. 4,013,465 describes a method to produce antireflective textured surfaces that are broadband with large angular acceptance. The microtexture is characterized by a surface covered with a regular array of conical protuberances, where the feature sizes of the tapered protuberances are in general sub-wavelength. Such surface profiles are known in the art as "moth-eye" antireflective surfaces, since Bernhard (Endeavor 16, p. 76–84, 1967) first noticed that the eyes of night flying moths were covered with an array of sub-wavelength protuberances, and hypothesized that the function of this profile was precisely to reduce the reflectivity of the eyes of these moths making them less detectable to predators. The moth-eye microtexture acts effectively as a gradient index layer, and therefore has excellent antireflective properties when compared to multi-layer thin-film coatings.

The moth-eye profile has an advantage over other textured surfaces, such as those produced by acid etching, in that it possesses a very smooth profile free of overhangs, voids, or cusps that could lead to degradation during the release phase of polymer replication. Thus a single moth-eye master can generate a multitude of daughter surfaces with very little loss of fidelity. Despite all the benefits of the moth-eye antireflective surface, a reliable and cost effective method for producing moth-eye textures over large areas with high uniformity has not been developed.

The Clapham and Hutley patent suggests a photo-exposure method to produce the moth-eye microtexture. The patent further discloses the specific technique of interference lithography that involves interfering multiple beams of coherent light, to create the moth-eye profile. The distinct benefit of this technique is that it yields relatively high contrast sub-wavelength intensity variations. However, it is known that interference lithography has some drawbacks. For example, the optical system that generates the interference pattern must be very stable in space and time. Difficulty in meeting the requirement of stability leads to reduction in the reproducible yield of high quality exposures. A more serious drawback is the difficulty with achieving large areas of spatial uniformity in the pattern, as any non-uniformity in the spatial distribution of the light intensity of the laser beams will be recorded in the pattern. Therefore, there is a need for another technique that is capable of fabricating microtextured surfaces which are similar to the moth-eye patterns produced by interference lithography, but have greater uniformity and are more amenable for scale-up to large areas.

Another limitation of interference lithography is the strict periodicity of the pattern generated by this technique. In order to add arbitrary non-periodic features to the surface profile, additional fabrication steps must be introduced to the process. Gombert et al. U.S. Pat. No. 6,359,735 describes a two-step process that combines a periodic moth-eye pattern with a randomized rough surface. In this patent, the periodic moth-eye pattern is written using interference lithography, while the non-periodic portion is achieved with a separate step, such as sand blasting, mechanical grinding, or exposure of photoresist to a laser speckle pattern. A new method for creating antireflective microtextured patterns that was not limited to strictly periodic patterns would simplify this process. This new method might also enable the fabrication of quasiperiodic patterns whereby the distribution of protuberances do not fit on a perfectly regular grid, but deviate from periodicity in a subtle, but precise way. A quasiperiodic microtextured surface may have desirable optical properties distinct from either periodic or completely random microtextured surfaces.

A new technique is proposed in this invention for the fabrication of antircflective surfaces. This technique enables the production of microtextures that have the following features: effective antireflectivity over a broad wavelength range, wide angular acceptance of incident light, pliability, ease of patterning non-periodic or quasiperiodic features, ease of scalability to large areas, high manufacturing yield, and low production cost.

SUMMARY OF THE INVENTION

The object of this invention is to provide a method for forming antireflective microtextured surfaces that involve exposing a photosensitive material with UV radiation through a photolithography mask, or in short 'photomask'. The photomask can be a binary screen mask, a phase shift mask, or their combination. The key inventive concept is the use of the photomask to spatially modulate the intensity of the UV radiation. Photomasks have been used extensively in the semiconductor industry to write microelectronic circuits of ever decreasing physical dimension. However, the photomask has thus far been overlooked regarding the fabrication of antireflective microtextures that are effective for visible light. In accordance with the object of this invention, it is shown that the photomask is a tool well suited for the fabrication of a specific class of surface relief profiles that possess excellent antireflective properties and also ease of replication.

The use of the photomask allows good control over the microscopic details of the surface profile since the light intensity distribution depends precisely on the optical properties of the photomask apertures and phase shifters. Further, the photomask provides greater freedom in pattern design since the arrangement of apertures and phase shifters are subject to few constraints. Thus, another object of this invention is to provide a method for patterning that, compared to methods in the prior art, allows greater freedom in the specification of the antireflective profile, yet more control over the actual fabrication of the specified rmicrotextured surface.

It is still another object of this invention to provide a method for creating large-area antireflective microtextured surfaces that are effectively seamless and free of defects. The use of the photomask is particularly suited for scaleup processes that involve step-and-repeat procedures, due to the uniformity and reproducibility of the individual exposure fields that make up the larger pattern. Alternatively, photomasks are routinely manufactured in large-area geometries of high uniformity and quality. Therefore the method of forming large-area surface relief profiles may simply start with procurement of a large-area photomask.

The method of using a photomask for fabricating large-area microtextures enables the production of high quality surfaces profiles that may be efficiently replicated to produce effective and inexpensive antireflective treatments. Additional objects, features and advantages of the invention will become apparent from a consideration of the included drawings and ensuing detailed description.

DETAILED DESCRIPTION OF THE INVENTION

The method of this invention for producing an antireflective treatment may be described as comprising three major steps: (a) mastering, (b) replication, and (c) distribution. In the context of this invention, 'mastering' refers to the process of generating a large area defect free microtextured surface relief in an arbitrary substrate. 'Replication' refers to the process of transferring the surface profile onto a material with the desired optical and mechanical properties thereby forming an antireflective treatment. 'Distribution' refers to the process of applying the replicated microtextured material onto an optical component to create a consumable antireflective product. The inventive method disclosed herein primarily addresses the mastering process. Since all three steps are interrelated, the details of the inventive mastering have ramifications that affect the performance of the final replicated and distributed antireflective treatment.

Figure 1A:
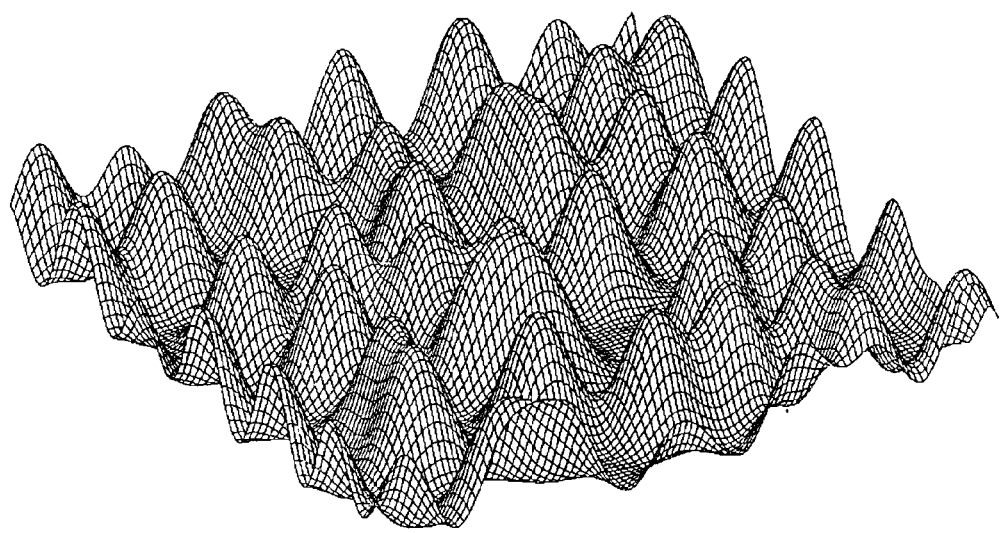
FIG. 1A shows the isometric view of a non-periodic engineered array of protuberances (EAP).
Figure 2A:
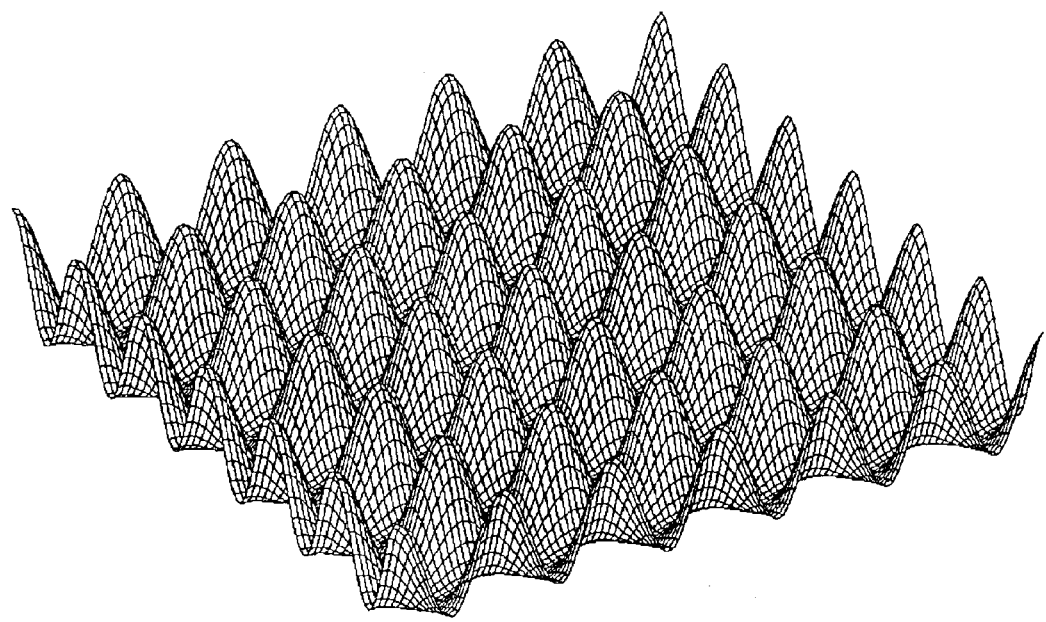
FIG. 2A shows the isometric view of an ordered EAP arranged in a square lattice.

The inventive mastering process enables production of a microtextured surface that consists of an engineered array of protuberances (EAP) that has excellent antireflective properties. The EAP microtextured surface is characterized by an array of microscopic protuberances arranged in a pattern that may be periodic, quasiperiodic, or arbitrarily non-periodic. FIG. 1A and FIG. 2A show examples of EAP structures with a non-periodic array and a periodic square array, respectively. The EAP microtexture represents a generalization of prior art antireflective surfaces fabricated by interference lithography, which were limited only to strictly periodic arrangements of protuberances. The increased freedom in pattern geometry afforded by the inventive process may have distinct advantages for antireflective performance. In particular, the use of quasiperiodic microtextured surfaces (QPMS) as antireflective microtextures has not been adequately explored in the prior art. The concept of the EAP microtexture extends to a non-periodic pattern of protuberances, which in general refers to a specific engineered array that may have desirable visual properties impossible with a more ordered array. For instance, the protuberances may be flattened in regions of the surface to draw characters or logos that will appear slightly more reflective than the surrounding area.

Figure 1B:
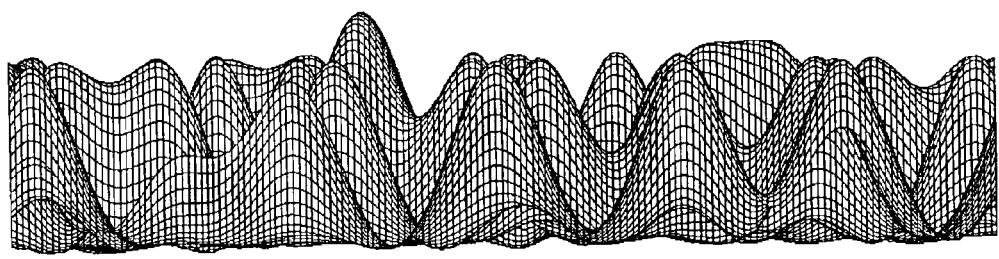
FIG. 1B shows the side view, with a cross-sectional cut, of the non-periodic EAP structure shown in FIG. 1A.
Figure 2B:
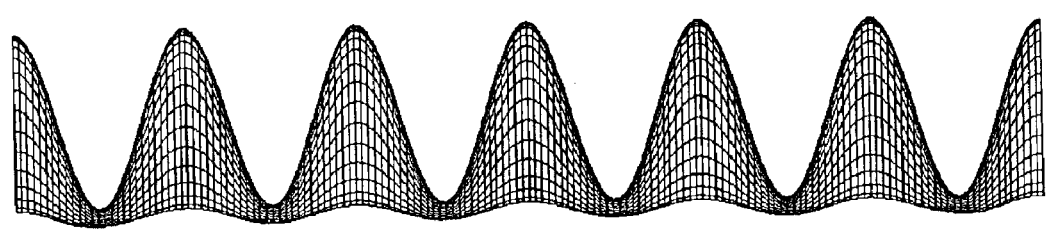
FIG. 2B shows the side view, with a cross-sectional cut, of the ordered EAP structure presented in FIG. 2A.

The profile of the EAP microtexture must conform to specific design rules to meet the requirements of a high-quality antireflective surface. FIG. 1B and FIG. 2B show profiles of a non-periodic and a periodic EAP structures. Consider an antireflective texture that is optimized for the waveband from the lower wavelength $\lambda_a$ to upper wavelength $\lambda_b$ with a maximum reflectance in the waveband of $R_{max}$. The EAP microtexture must act in the regime of the effective index approximation in order to avoid prominence of diffracted beams. Therefore, the distance between neighboring protuberances must be on the order of, or smaller than, $\lambda_a$ divided by the refractive index of the substrate. Further, the protuberances must be tapered such that the EAP can mimic a gradient index material. The protuberances must have a height h that is greater than $\frac{1}{3}$ of $\lambda_b$ for the gradient-index to act effectively in suppressing reflectance. According to prior art, such materials are effective to reduce the reflectance over wide angles of incident light. Finally, the shape of the protuberances must be smooth profiles, free of cusps, overhangs, or voids that would inhibit easy release of materials that are coated onto the master. This is essential to facilitate efficient replication of the microtexture. These geometric requirements for an EAP microtexture are achievable by the inventive process that uses a photolithography mask to pattern the microtextured master.

Mastering Using Photolithography Mask

One of the embodiments of this invention is a method of obtaining an engineered array of protuberances (EAP) in photoresist. The first step is to pattern the microtexture into photoresist. The photoresist is exposed through a photomask in such a way that the light intensity profile closely resembles the desired engineered structure, which may be a regular array of protuberances, the QPMS, or a non-periodic structure. The following two) approaches: (1) projection photolithography or (2) contact photolithography can be used for mask exposure.

Approach I: Projection Photolithography.

Projection photolithography requires a photolithography projection tool, sometimes called a projection aligner or mask aligner, with a reticle comprised of a binary mask, a phase shift mask, or their combination. The required light intensity profile is formed in photoresist by optimization of the modulation transfer function (MTF). The MTF depends on the numerical aperture (NA) of the aligner lens, illuminating wavelength, and spatial coherence of the light source. An aligner with ultraviolet light below 250 nm, typically referred to as DUV, should be employed in conjunction with a high NA lens to obtain optimal contrast at feature sizes below 300 nm.

The approach described below assumes the general case of a ZX-aligner tool with 1:Z reduction factor. For instance, for a 5X aligner (Z=5), a periodic pattern with period 1250 nm defined in the reticle (the object plane) will be reduced to the period 250 nm in the image plane.

The modulation transfer function of an aligner can be approximated by the bright-field MTF for an optical system with a uniformly illuminated circular aperture:

$$MTF=(I_{max}-I_{min})/(I_{max}+I_{min})=2(\phi-\cos\phi\cdot\sin\phi)/\pi,$$

Figure 3:
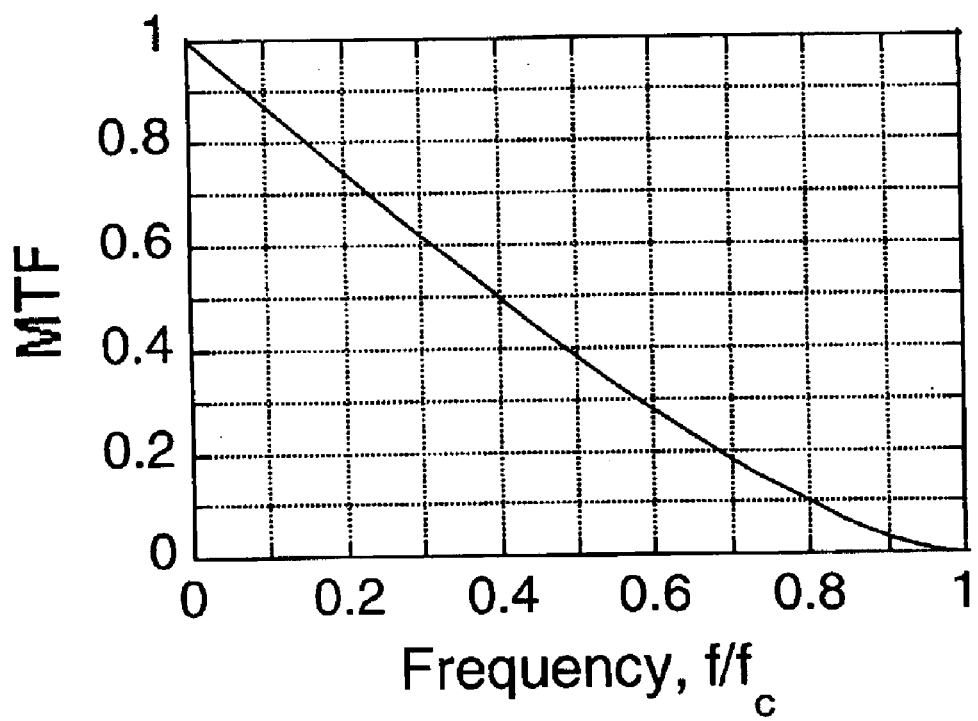
FIG. 3 is a curve showing the simple bright-field modulation transfer function (MTF) for a periodic structure.

The dependence is shown on FIG. 3. Here $\cos\phi=\lambda f_i/2NA$, where $\lambda$ is the light wavelength, and $f_i$ is a spatial frequency defined as the number of lines per unit length in the image plane. The MTF vanishes at the critical frequency $f_{ic}=2NA/\lambda$. In order to take into consideration the reduction factor Z and deal with the dimensions and spatial frequencies, $f_o$, defined in the reticle, i.e. in the object plane, we can modify the latter expressions as $\cos\phi=Z\cdot\lambda\cdot f_o/2NA$, where $f_i=Z\cdot f_o$, and the critical frequency $f_{oc}=2NA/\lambda\cdot Z$).

The point spread function (PSF) is another useful figure of merit to characterize the quality of an optical system, and its Fourier transformation is related to the MTF function. The PSF is defined as an image of a point source. The image of an arbitrary pattern, then, can be presented as a convolution of the PSF and the pattern. FIGS. 1 and 2 show the EAP structures obtained by such an approach. Each protuberance is approximated by a PSF function. When two points in the image plane are closer than the width of the PSF, the intensities overlap significantly leading to a reduction in contrast. The PSF approach is convenient for consideration of the contrast variation in non-periodic patterns. While MTF concept is more convenient for consideration of periodic patterns.

Figure 4:
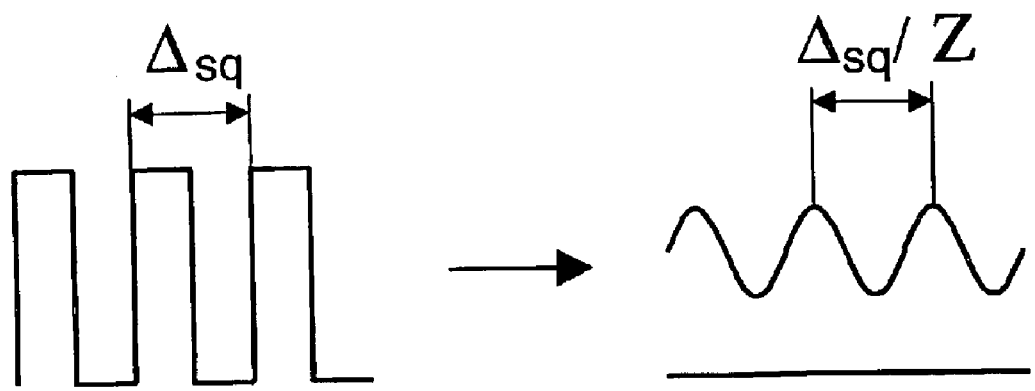
FIG. 4 is a schematic drawing of the transformation of a square illumination pattern, defined by a binary mask, into a sinusoidal pattern projected onto an aerial surface.

The MTF for a periodic pattern is also called the contrast transfer function. The spatial frequency $f_o$ of a periodic structure (grating) defined in the object plane with a period $\Delta_o$, FIG. 4, can be expressed as $f_o=1/\Delta_o$. The critical grating period in the object plane is defined correspondingly as $\Delta_{oc}=Z\cdot\lambda/2NA$. And the critical grating period in the image plane is defined as $\Delta_{ic}=\lambda/2NA$. The aligner optical system is not able to image the grating with the period smaller then $\Delta_{oc}$.

One specific embodiment of the EAP structure consists of a microstructure with sinusoidal profile. Fortunately, this is easily achieved with the projection lithography technique due to the fact that the image of a binary periodic pattern defined in the reticle with the frequency $f_{sq}$ and period $\Delta_{sq}$ is sinusoidal, when $0.5\ f_{oc}<f_{sq}<f_{oc}$, or $\Delta_{oc}<\Delta_{sq}<2\cdot\Delta_{oc}$, FIG. 4. Indeed, a periodic square function with some duty cycle and period $1/f_{sq}$ can be decomposed into a Fourier series with frequencies $f_{sq}, 2f_{sq}, 3f_{sq}\ldots$. All multiple frequencies above $f_{oc}$ will be filtered out by the aligner's optical projection system leaving only one frequency $f_{sq}$, similar to the effect of a low pass frequency filter. The same can be understood using the PSF approach. The intensity profile of an aperture image has a PSF like shape if the aperture size, $d_{aperture}<2\cdot\Delta_{oc}$. In other words we can say that only one PSF width is required to image the aperture. For a periodic pattern the requirement on the aperture size is more strict: $d_{aperture}\cdot\Delta_{sq}$, because the aperture size is limited now by the grating period. If the period of the grating of apertures, $\Delta_{sq}$, is so small that each aperture is imaged by only one PSF, then a sinusoidal like profile of the light intensity is formed in the image plane. Indeed, we can see that effect in FIG. 2B, where each protuberance is approximated by a PSF function but their combination appears sinusoidal. In the case of a non-periodic pattern the distance between two close neighbour apertures, $d_{neigh}$, should be within the following constraints: $\Delta_{oc}<d_{neigh}<2\cdot\Delta_{oc}$. This is to insure that there are no flat regions in the intensity profile.

EXAMPLE 1

A typical period of the periodic EAP structure for visible light is 250 nm. By visible light, we mean electromagnetic radiation with wavelength in vacuum in the range from 390 nm to 800 nm. An aligner with NA=0.65 and DUV source wavelength $\lambda$=248 nm will give in the image plane $\Delta_{ic}$=191 nm, $f_i/f_{ic}$=0.76, and MTF=0.14. A similar aligner with NA=0.75 gives $\Delta_{ic}$=165 nm, $f_i/f_{ic}$=0.66, and MTF=0.23.

Special contrast enhancement techniques like oblique off-axis illumination, single-sideband technique, and other aligner specific techniques can significantly increase the value of the modulation transfer function. A phase shift mask, or a binary mask combined with phase shift elements can be employed to increase the contrast of the image as well. Examples of phase shift masks are given below in the context of contact lithography.

Another way to increase the modulation transfer function is to reduce the exposure wavelength.

EXAMPLE 2

An aligner with NA=0.65 and DUV light source $\lambda$=193 nm gives a critical period in the image plane $\Delta_{ic}$=148 nm. Thus for the 250 nm period EAP structure, we have $f_i/f_{ic}$= 0.59, and MTF=0.3 or 30%. That is much better than 14% for the light source with $\Delta$=248 nm (see Example 1).

Some of the contrast enhancing techniques mentioned above may be combined together to further increase the contrast enhancing effect.

The photoresist non-linearity, developer concentration and temperature, and developing time can be used to optimize the resulting profile.

Approach II. Contact Lithography

Figure 5:
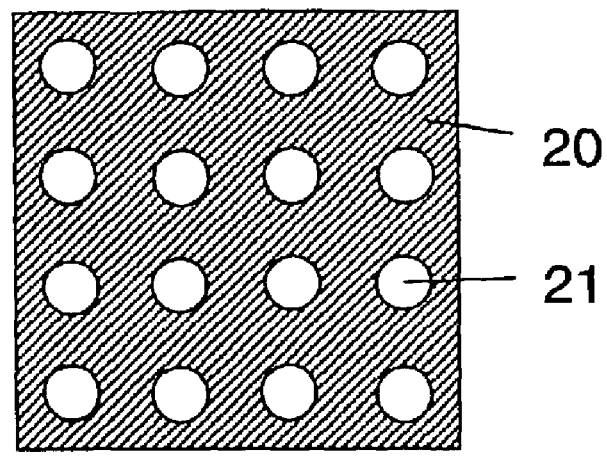
FIG. 5 is a schematic diagram (plan view) of an example dark field mask with a square array of sub-wavelength apertures.
Figure 6:
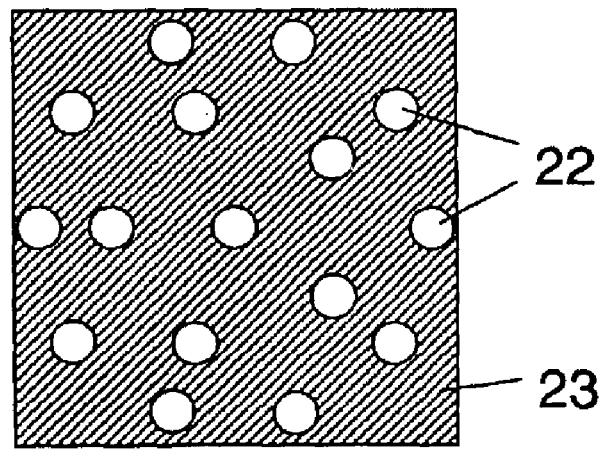
FIG. 6 is a schematic diagram (plan view) of an example dark field mask with a quasiperiodic array of sub-wavelength apertures.

A subwavelength mask in contact mode can be used with DUV to get the intensity profile of the EAP with a nearest neighbor spacing less than 250 nm. Only light of the zero diffraction order passes through the sub-wavelength aperture. The light has maximum intensity at the center of the aperture provided that incident light is perpendicular to the aperture plane. The intensity of light drops toward the edges. It also decreases forward from the aperture because the light beam quickly diverges with the distance. A smaller aperture creates wider beam divergence, and conversely a larger aperture creates a less divergent beam. An engineered array of sub-wavelength apertures is used to create the intensity profile of the EAP. The type of photoresist (positive or negative), photoresist non-linearity and the developer should be adjusted to obtain the profile of the desired shape. A typical example of a dark field chrome binary mask 20 with square array of sub-wavelength circular apertures 21 is presented on FIG. 5. Additionally, non-periodic or quasi-periodic patterns (as in FIG. 6) of sub-wavelength apertures 22 in a binary mask 23 can be used to get corresponding non-periodic patterns of conical protrusions in the photoresist.

Figure 7:
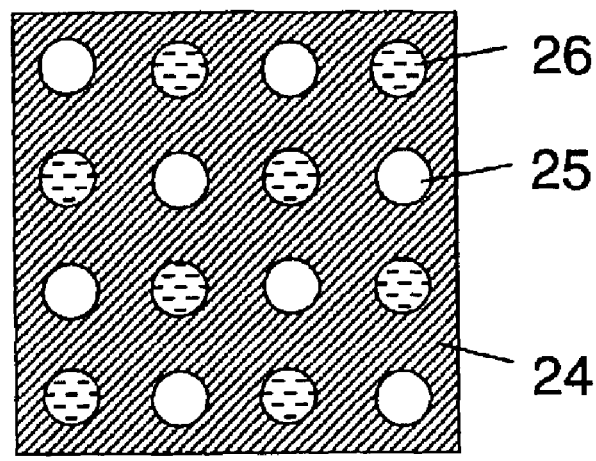
FIG. 7 is a schematic diagram (plan view) of an example dark field mask with a square array of sub-wavelength apertures coupled to 180 degree phase shift elements.
Figure 8:
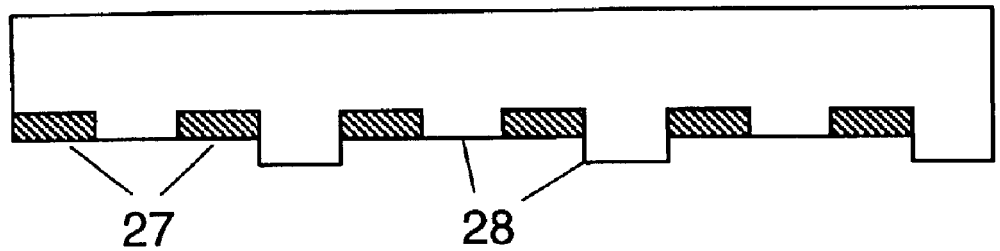
FIG. 8 is a schematic diagram (cross section) of an example light-coupling mask combined with phase shift elements, for contact sub-wavelength lithography.
Figure 9:
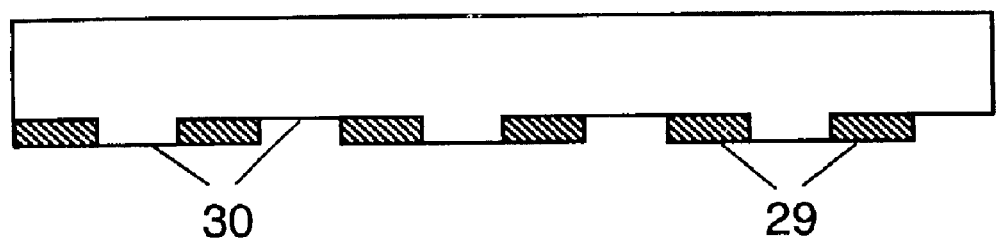
FIG. 9 is a schematic diagram (cross section) of an example metal embedded mask with phase shift elements, for contact sub-wavelength lithography.
Figure 10:
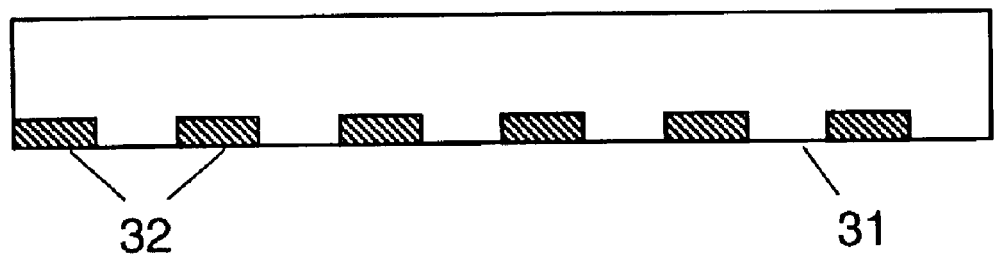
FIG. 10 is a schematic diagram (cross section) of an example embedded phase shift attenuated mask for contact sub-wavelength lithography.

To increase the contrast one can employ a phase shift mask (PSM), or a binary. mask combined with a phase shift mask. An example of such a composite mask 24 is presented on FIG. 7. It shows a dark field mask with a square array of circular sub-wavelength apertures 25 and 26, where open circles do not introduce any phase shift 25, and where the shaded circles introduce 180 degrees phase shift 26. Apertures might have an arbitrary form, for instance: square, elliptical, or other. Other examples of composite phase shift masks include light-coupling masks (LCM) as in FIG. 8, which comprises a metal-embedded mask 27 and a phase shift mask 28. Another example is a metal-embedded mask (MEM) 29 with phase shift elements 30 as in FIG. 9. FIG. 10 presents an example of an embedded attenuated phase shift mask (AttPSM) 31 with phase shift elements made of molybdenum silicide 32.

Figure 11:
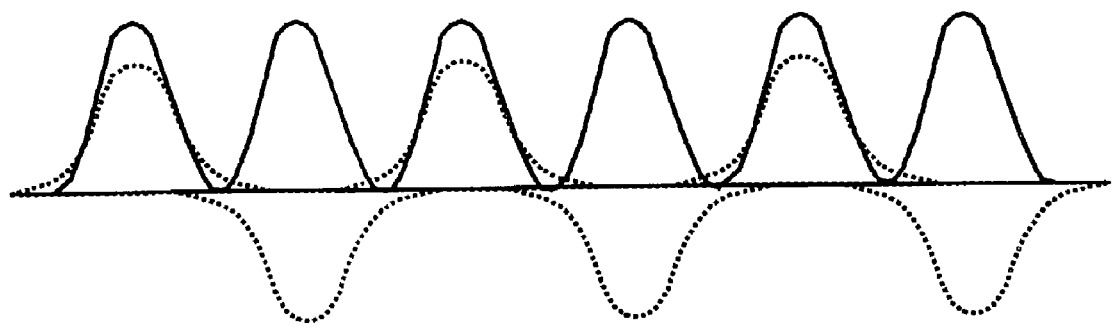
FIGS. 11 and 12 are curves schematically illustrating the electric field (dashed lines) and light intensity profiles (solid lines) for a simple phase shift mask, and for a phase shift attenuated mask, respectively.
Figure 12:
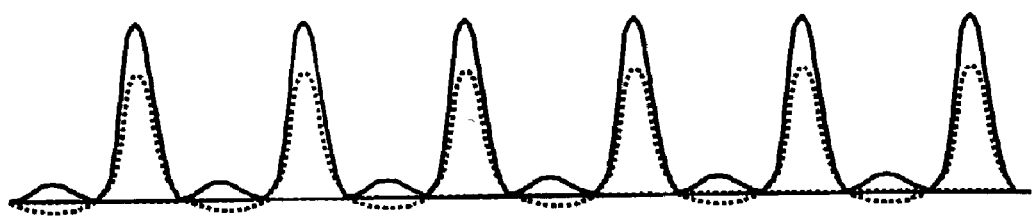

The effect of a phase shift mask that employs 180 degrees phase shift elements is shown schematically in FIGS. 11 and 12. The electric field distributions are indicated by dashed lines, and the light intensity distributions are indicated by solid lines. A phase shift metal mask corresponds to FIG. 11 and an attenuated phase shift mask corresponds to FIG. 12. A sub-wavelength mask thus includes a binary mask, a phase shift mask, or a combination of a binary mask with a phase shift mask Contact lithography can employ a flexible mask made of a polydimethylsiloxane (PDMS) flexible membrane or similar membrane with a shorter cut-off transparency wavelength. With a flexible mask, contact between the mask and photoresist over the entire substrate is achieved by applying air pressure to the flexible mask. Therefore the mask conforms to any gentle undulations or other deviations from planarity of the surface of the photoresist.

Figure 13:
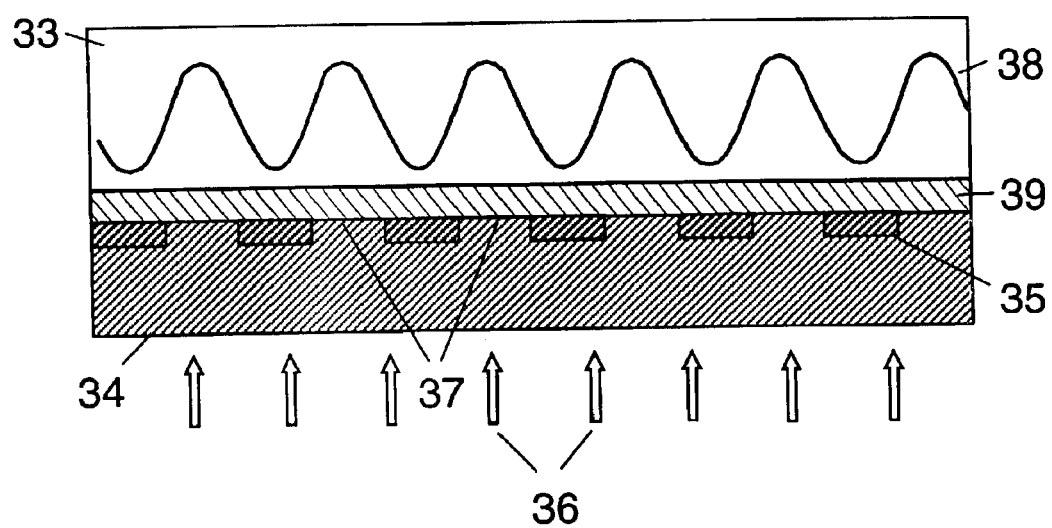
FIG. 13 is a schematic diagram illustrating, in cross section, a contact lithography technique where a sub-wavelength mask itself serves as the substrate for contact lithography, and exposure is performed by illuminating the back side of the mask.

Another way to employ the contact mode technique is to use back side exposure, where the photomask itself serves as a substrate, as in FIG. 13. Photoresist 33 is spun on the front surface of the mask 34. An embedded mask is necessary to ensure that the front surface of the mask is flat. Such masks are suited for coating with a photoresist. Chrome or phase shift elements, like molybdenum silicide, can be used for forming dark fields 35. The exposure is performed by illuminating 36 the back side of the mask 34. Here the sub-wavelength apertures 37 are in intimate contact with the photoresist 33. This geometry leads to reduction of the wavelength by a factor of the refractive index of the photoresist, which in turn allows reduction of the sub-wavelength aperture size and distance between apertures. This reduction of the exposure wavelength is an advantage compared to the projection lithography technique.

Photoresist Development

Following exposure, either in projection mode or contact mode, the photosensitive material, i.e. photoresist, is developed to produce the engineered array of protuberances (EAP).

In contact mode with back side exposure, the photoresist is developed to form the EAP structure 38 of the front surface of the photomask.

This backside illumination method assumes multiple uses of the photomask. To re-use the photomask, the photoresist must be removed. To facilitate release of the photoresist from the mask surface a thin release coat 39 can be applied to the mask prior to the original photoresist coat. This release coat must be optically transparent and not so thick as to significantly affect the intensity profile in the photoresist. Another purpose of the release coat is to protect the mask from destruction due to excessive stress in the release step of the subsequent replication process, which is described below.

Pattern Transfer by Etching

Figure 14:
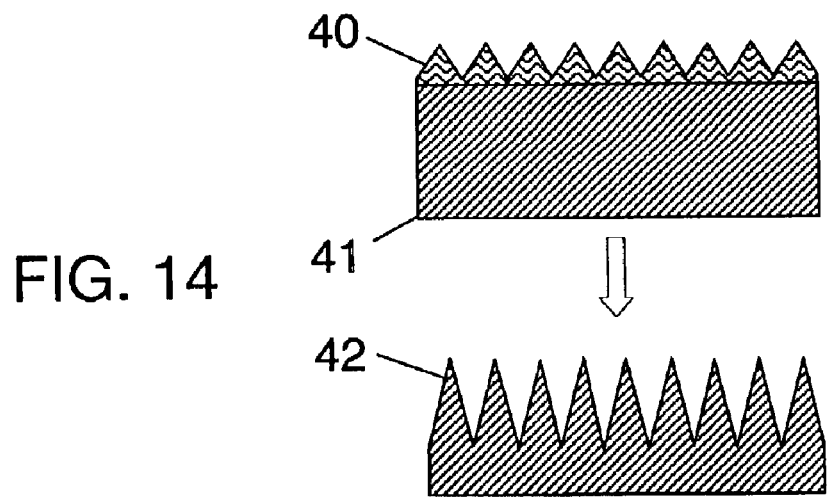
FIG. 14 is a cross sectional schematic diagram illustrating the transfer of an engineered array of protuberances from developed photoresist into an underlying substrate. The photoresist itself acts as an etch screen mask for the substrate.

In the case that the EAP structure in photoresist 40 (FIG. 14) is difficult or impossible to fabricate with the desired parameters, it may be necessary to a transfer the EAP structure into the underlying substrate 41 by a chemical etch process. The desired parameters include but are not limited to the height of the EAP, and the shape and durability of the protuberances. A chemical etch process, where an etch screen mask comprised of the initial photoresist carrying the EAP structure, is used for the structure transfer. Wet or plasma etch processes can be employed. The resulting EAP structure 42 formed in the underlying substrate has a modified profile compared to the original. The etch rate ratio of the photoresist versus the substrate, i.e. the etch selectivity, must be carefully chosen in order to obtain the desired EAP profile.

Figure 15:
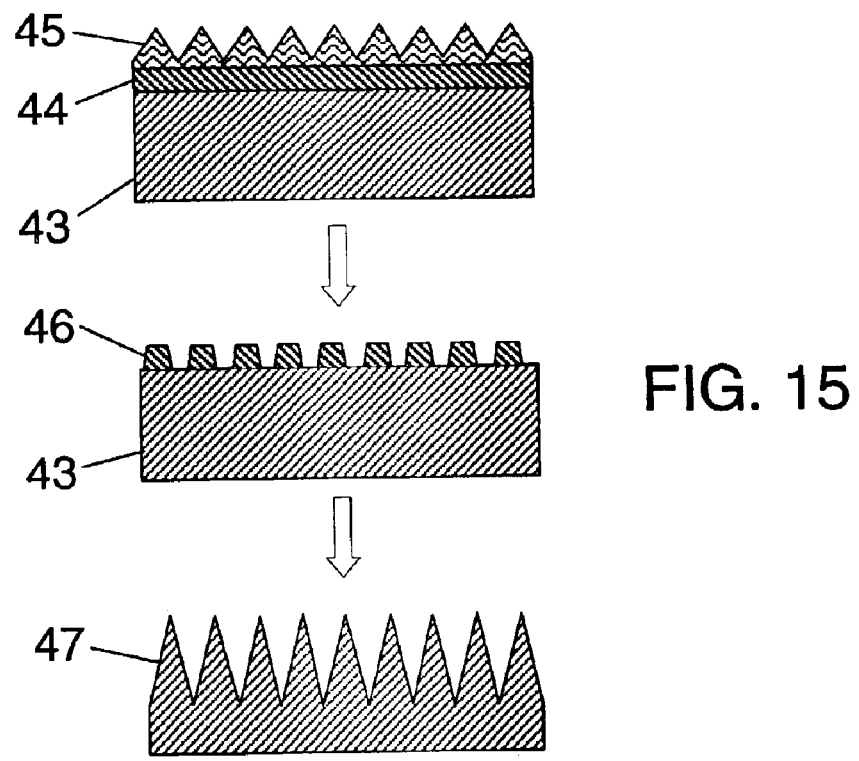
FIG. 15 is a cross sectional schematic diagram illustrating a two-step process for the transfer of an engineered array of protuberances from developed photoresist into a final underlying substrate, which involves etching an intermediate layer of chrome, silicon dioxide, or other suitable material.

It is possible that the desired EAP profile is still not achievable due to inadequate selectivity between the photoresist and the underlying substrate. In this case, to improve the selectivity, an additional etch process is required along with an intermediate etch screen mask (FIG. 15). An underlying substrate 43 carries an intermediate layer 44 of chrome, silicone dioxide, or other suitable material from which the intermediate etch mask is made. The first etch process transfers the original EAP pattern 45 (residing in photoresist) into the intermediate layer 46. The second etch process further transfers the pattern into the underlying substrate 47. An example of the second etch process was described by H. Toyota et al. (Jpn. J.Applied Physics, 40, L747, 2001), where an antireflective sub-wavelength structure on a fused silica substrate was fabricated using a chrome etch screen mask with a high-density fluorocarbon plasma reactive ion etching process.

Large Area Microtextured Surfaces

One embodiment of the present invention is a large uniform area EAP structure, which can be obtained in projection mode by repetitive exposures of the photoresist using a photomask and a mask aligner stepper with resolution better than 0.5 $\mu$m. The same technique can be used in contact photolithography mode, where a micrometer stage, instead of the stepper, can be used to translate either the mask or the substrate. The exposed area is limited only by the size of a substrate and by the travel limitations of the aligner stepper. Commercial aligner steppers may be modified to enlarge the travel. In this context "large area" refers to areas greater than can be uniformly coated in a typical vacuum deposition chamber, which is comparable to the screen size of a big screen TV, or a glass window used for artwork protection.

Using the backside illumination method of contact mode lithography, as described above, a large area EAP pattern is obtained by using a large area photomask. The large area photomask can be produced directly by mask making equipment or by means of assembling an array of smaller sized photomasks and joining them together. In the latter case the pattern should extend to the edge of each individual photomask thus leaving no gaps between masks. The photoresist can be spun directly onto the assembled mask or on each individual small mask before assembly. The photoresist can be developed before of after assembly to form the large area surface relief.

Replication of EAP Microtexture

Replication of the EAP structure formed in photoresist can be attained by the following methods:
  a) coating the replicated surface by curable polymer, resin, or other curable material. The curing:mnay be achieved by e-beam, UV radiation, or other means. The coating is cured and then released from the master.
  b) replication using roller embossing, roller imprinting or roller casting (McGrew U.S. Pat. No. #4,758,296).

These techniques can include as an intermediate step the production of a metal replica formed by galvanic replication (Galarneau et al. U.S. Pat. No #5,597,613).

Using the replication techniques described above a thin optically transparent film of large area can be produced carrying a microtextured antireflective surface. If desired, the processes can be extended to provide texturing for both sides of the film. This thin film can be applied to an optically transparent substrate like a glass, plastic, polymer, or other optical material in order to form an antireflective coating. The refractive indices of the film and the substrate must be closely matched for the procedure to work effectively. This technique is especially useful when direct definition of an EAP pattern on the substrate is difficult, expensive or impossible. The replication techniques significantly reduce the cost of production of an antireflective plastic film. Such films are easily distributed as an antireflective treatment for transparent substrates.

Distribution of the Textured Antireflective Film

If necessary, an adhesive may be used to bond the EAP antireflective film to a transparent substrate. The adhesive should be closely index matched to both the substrate and the film. A refractive index matching fluid can be used to fill any air gaps between the film, adhesive, or substrate. Alternatively, the index matching fluid can be used in the absence of adhesive. This may be particularly useful when the substrate is not flat due to surface roughness, scratches, or other damage.

Figure 16A:
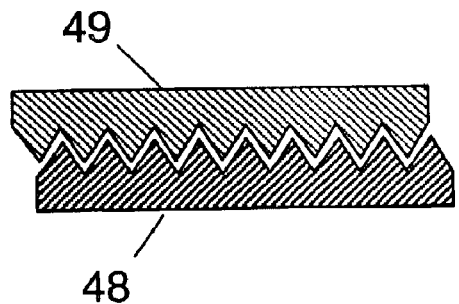
FIGS. 16A, 16B and 16C are cross sectional schematic diagrams, which together illustrate a method to shield the surface structure of an antireflective film with a protection layer during the attachment of the film to a substrate.
Figure 16B:
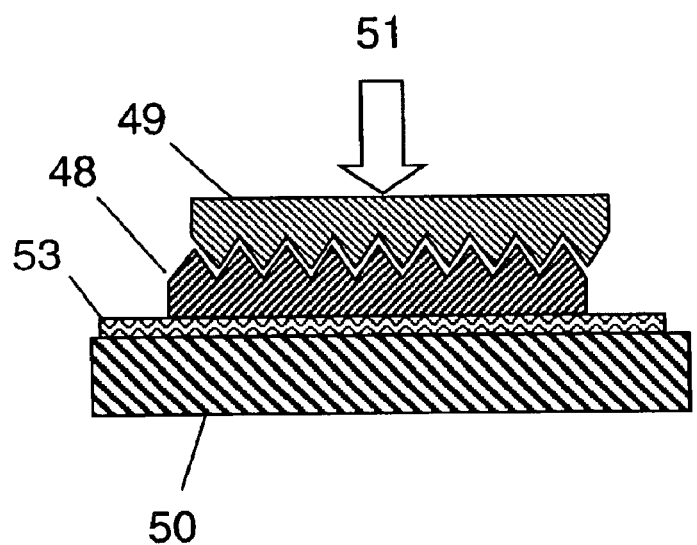
Figure 16C:
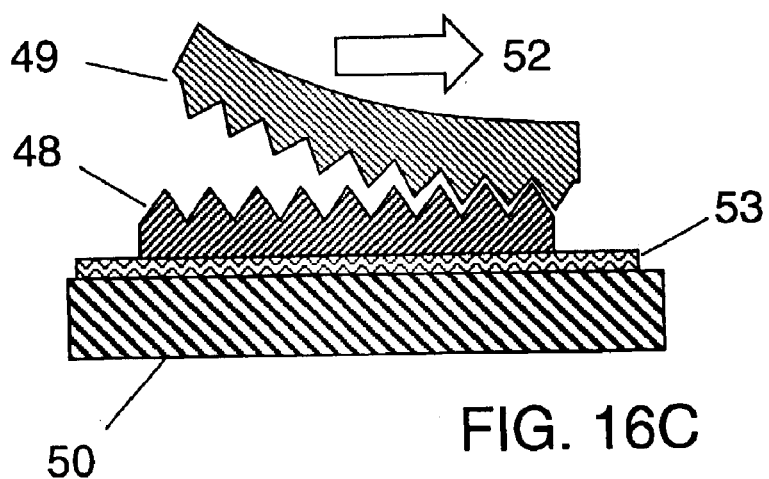

In order to protect the microtextured EAP surface during the attachment of the antireflective film 48 to a substrate 50, a protection layer 49 is required (see FIG. 16A and FIG. 16B). Indeed, during the attachment, the film 48 may be subject to excessive forces 51 that can potentially damage the surface structure (FIG. 16B). The protection layer 49 may be formed by applying an e-bearn or UV-curable resin, polymer or other suitable material to the surface of the thin film 48 carrying the EAP structure. A composite film consisting of the protection layer 49 and the antireflective thin film 48, as shown in FIG. 16A, is constructed. The EAP on both surfaces are complimentary thus protecting each other during pressurized application of the film 48 onto the substrate 50. The protection film 49 is peeled off (denoted by the arrow 52) after the composite film is securely attached to a substrate by an adhesive 53, as in FIG. 16C.

The invention described in this patent presents an antireflective treatment that possesses the following properties: extremely low reflectance and high transmittance over a broad wavelength band, wide angular acceptance, cost effectiveness, large area, and flexibility. It provides a useful method for producing an easily distributed antireflective treatment on instrument displays, clocks and other timekeeping devices, portable electronic displays, and glazing materials for the picture frame industry. These treatments would also be useful for TV screens, computer monitors, LED screens of portable computers, personal data assistants, GPS units, cellular phones, the windows in storefronts, and other applications. A flexible polymer film carrying an antireflective treatment would find a multitude of uses. Plastic photo-protectors, transparent scotch tape, and novel packaging materials may benefit. In particular, pliable antireflective treatments will be essential for the new generation of flexible polymer electronic "roll-up" displays, manufactured by electrophoretic or polymer LED technologies.

One important antireflective application that requires the described properties, especially low cost and large area, are protective layers for semiconductor solar cells. In addition, an improved flexibility of the protective screen makes it possible to include a whole new class of cutting edge flexible thin-film solar cells. In this realm, any slight increase in efficiency, such as enabled by a properly engineered antireflective treatment, translates into significant added value to the final product.

While the above description contains many specific procedures and features, these should not be taken as limitations on the scope of the invention. Many variations are possible regarding the above methods for fabricating antireflective microtextures. For example, a photomask may be used in proximity photolithography to achieve texturing, especially with a short wavelength exposure source. Alternatively, ultraviolet light with wavelength longer or shorter than DUV may be used to expose the photoresist. Accordingly, the scope of the invention should be determined not by the illustrated embodiments, but by the appended claims and their legal equivalents.

What is claimed is:

1. A method for fabricating an antireflective surface that is effective for visible light, wherein said method is a photo-exposure method, said photo-exposure method comprises exposing a photosensitive layer to a pattern of illuminating radiation, wherein said illuminating radiation is ultraviolet light, and said pattern is achieved by illumination through a photolithography mask.

2. A method according to claim 1 wherein said pattern is periodic.

3. A method according to claim 1 wherein said pattern is non-periodic.

4. A method according to claim 1 wherein said pattern is quasiperiodic.

5. A method according to claim 1 wherein said antireflective surface comprises an engineered array of protuberances, where said protuberances have the total height from bottom to apex greater than 200 nm and spacing between adjacent protuberances less than 500 nm.

6. A method according to claim 5 wherein said engineered array of protuberances is produced by chemically developing said photosensitive material.

7. A method according to claim 6 wherein said engineered array of protuberances is transferred to an underlying substrate by an etch process, said etch process employs an etch screen mask, said etch screen mask is comprised of said chemically developed photosensitive material, and said transferred engineered array of protuberances in said underlying substrate may have a modified profile, whereby said modified profile is different from the original engineered array of protuberances.

8. A method according to claim 6 wherein said chemically developed photosensitive material resides on an underlying substrate, wherein said underlying substrate carries an intermediate layer, said photosensitive material is a primary etch screen mask, said primary etch screen mask is used to etch a secondary etch screen mask, said secondary etch screen mask is etched from said intermediate layer, and said secondary etch screen mask is subsequently used to etch an engineered array of protuberances in the underlying substrate.

9. A method according to claim 5 wherein said photolithography mask comprises a sub-wavelength mask with a grating, wherein said grating has the smallest distance between apertures less then 500 nm.

10. A method according to claim 9 wherein said photosensitive layer is brought into direct contact with said photolithography mask during exposure with ultraviolet radiation.

11. A method according to claim 10 wherein said photosensitive material is coated directly onto the front side of said photolithography mask prior to exposure, said photosensitive material is exposed from the back side of said mask, and said photosensitive material is subsequently chemically developed, whereby said photosensitive material takes on the form of said engineered array of protuberances.

12. A method according to claim 11 wherein said photolithography mask is coated with a release layer prior to coating with said photosensitive material, whereby said release layer facilitates the release of said photosensitive material from said mask, and wherein said mask is subsequently re-used.

13. A method according to claim 10 that comprises: releasing of said photolithography mask from said photosensitive material, translating the mask a predetermined distance, bringing said mask back into contact with said photosensitive material, exposing said photosensitive material, and then repeating, whereby the total area of the patterned array is increased to cover an arbitrarily large surface.

14. A method according to claim 11 wherein said photolithography mask is of large area.

15. A method according to claim 5 wherein said photosensitive layer is exposed by employing a projection lithography apparatus, wherein said mask is a reticle, and wherein said pattern of illuminating radiation is projected onto said photosensitive material.

16. A method according to claim 15 that comprises shifting periodically said photosensitive material in relation to said pattern of illuminating radiation, and whereby the total exposed area of said photosensitive material is increased.

17. An article that is a substrate having a surface produced by method in accordance with claim 5.

* * * * *